United States Patent [19]
Matsugu et al.

[11] Patent Number: 5,225,892
[45] Date of Patent: Jul. 6, 1993

[54] POSITIONAL DEVIATION DETECTING METHOD

[75] Inventors: Masakazu Matsugu, Atsugi; Kenji Saito, Yokohama; Jun Hattori, Zama, all of Japan

[73] Assignee: Canon Kabushiki Kaisha, Tokyo, Japan

[21] Appl. No.: 939,429

[22] Filed: Sep. 4, 1992

Related U.S. Application Data

[63] Continuation of Ser. No. 650,863, Feb. 5, 1991, abandoned.

[30] Foreign Application Priority Data

Feb. 5, 1990 [JP] Japan .................. 2-25489

[51] Int. Cl.⁵ ............................................ G01B 11/27
[52] U.S. Cl. .................................. 356/401; 250/548; 378/34
[58] Field of Search ............... 356/354, 363, 373, 375, 356/344, 400, 401; 250/237 G, 548, 561; 355/53, 77; 378/34

[56] References Cited

U.S. PATENT DOCUMENTS

| | | | |
|---|---|---|---|
| 4,037,969 | 7/1977 | Feldman et al. | 356/401 |
| 4,360,273 | 11/1982 | Thaxter | 356/354 |

FOREIGN PATENT DOCUMENTS

| | | | |
|---|---|---|---|
| 0237102 | 9/1987 | European Pat. Off. | |
| 0333326 | 9/1989 | European Pat. Off. | |
| 336537 | 10/1989 | European Pat. Off. | 356/400 |
| 56-157033 | 12/1981 | Japan. | |

*Primary Examiner*—F. L. Evans
*Attorney, Agent, or Firm*—Fitzpatrick, Cella, Harper & Scinto

[57] ABSTRACT

Disclosed is a method of detecting relative positional deviation of a first object with a first grating pattern having an optical power and a second object with a second grating mark having an optical power. Light diffracted by both the first and second grating marks forms a light pattern on a predetermined plane; wherein different diffraction beams of the light diffracted by both the first and second grating marks are displaceable along the predetermined plane in accordance with the relative positional deviation of the first and second objects, in the same direction and by substantially the same quantity; and the relative positional deviation of the first and second objects is detected on the basis of the position of the light pattern on the predetermined plane.

72 Claims, 6 Drawing Sheets

POSITIONAL DEVIATION DETECTING METHOD

This application is a continuation of prior application, Ser. No. 07/650,863 filed Feb. 5, 1991, now abandoned.

FIELD OF THE INVENTION AND RELATED ART

This invention relates to a positional deviation detecting method usable in a semiconductor device manufacturing exposure apparatus for photolithographic transfer of a fine pattern such as a semiconductor integrated circuit, for detecting positional deviation or the like between a mask (reticle) and a wafer at high precision.

In exposure apparatuses for use in the manufacture of semiconductor devices, the relative alignment of a mask and a wafer is one important factor with respect to ensuring improved performance. Particularly, as for alignment systems employed in recent exposure apparatuses, submicron alignment accuracies or more strict accuracies are required in consideration of the demand for a higher degree of integration of semiconductor devices.

In many types of alignment systems, features called "alignment marks" are provided on a mask and a wafer and, by utilizing positional information obtainable from these marks, the mask and wafer are aligned. As for the manner of executing the alignment, as an example there is a method wherein the amount of relative deviation of these alignment patterns is detected on the basis of image processing. Another method is proposed in U.S. Pat. Nos. 4,037,969 and 4,514,858 and Japanese Laid-Open Patent Application, Laid-Open No. Sho 56-157033, wherein so-called zone plates are used as alignment marks upon which light is projected and wherein the positions of light spots formed on a predetermined plane by lights from the illuminated zone plates are detected.

Generally, an alignment method utilizing a zone plate is relatively insensitive to any defect of an alignment mark and therefore assures relatively high alignment accuracies, as compared with an alignment method simply using a traditional alignment mark.

FIG. 1 is a schematic view of a known type alignment system utilizing zone plates. As an example, this type of position detecting system is disclosed in European Patent Application 0,333,326A2, filed under the name of the assignee of the subject application.

Mask 1 is adhered to a membrane 47 which is supported by a main frame 45 of an aligner through a mask chuck 46. Mask-to-wafer alignment head 44 is disposed above the main frame 45. For alignment of the mask 1 and a wafer 2, a mask alignment mark 3M and a wafer alignment mark 4W are formed on the mask 1 and the wafer 2, respectively.

Light emanating from a light source 40 is transformed by a light projecting lens system 41 into parallel light which is reflected by a half mirror 42 and impinges on the mask alignment mark 3M. The alignment mark 3M is provided by a transmission type zone plate, and positive first order diffraction light thereof is influenced by a convex lens function, converging at a point Q. The wafer alignment mark 4W is provided by a reflection type zone plate, and it has a convex mirror function (diverging function) for imaging the light, convergent at point Q, upon a detection surface 39.

Here, the signal light having been influenced by negative first order reflective diffraction of the wafer alignment mark 4W is not influenced by any lens function as the same passes through the mask M, and the light transmitted therethrough as zero-th order diffraction light is collected on detection surface 39 of a detector 38. Here, the term "zero-th order diffraction" means simple transmission or specular reflection.

In this Specification, the light influenced by m-th order diffraction by the mask 1 and subsequently influenced by n-th order diffraction by the wafer 2 and again influenced by l-th order diffraction by the mask, will be referred to as "(m, n, l)-th order light". Accordingly, the above-described light can be referred to as "(1, −1, 0)-th order light". This light provides the signal light.

In this type of positional deviation detecting system, any positional deviation between the mask 1 and the wafer 2 is detected on the basis of the position of incidence of the signal light upon the detection surface 39. There is a certain proportional relationship between the positional deviation $\Delta\sigma w$ and the displacement $\Delta\delta w$ of the position of incidence of the signal light upon the detection surface 39. The proportional constant thereof corresponds to the magnification of deviation detection. More specifically, if under such an arrangement the wafer 2 laterally shifts by $\Delta\sigma w$ relative to the mask 1, the position of incidence of the light on the detection surface 39 displaces by $\Delta\delta w$ which can be expressed as follows:

$$\Delta\delta w + \Delta\sigma w \times (bw/aw - 1)$$

Thus, the positional deviation is magnified by:

$$bw/aw - 1$$

This quantity "bw/aw −1" represents the deviation detecting magnification. Here, aw denotes the distance to the wafer from the point Q of convergence of the signal light emanating from the mask, and bw denotes the distance from the wafer to the detection surface 39. B detecting through the detection surface 39 the shift of the position of incidence of the signal light from its reference position as assumed when the mask and the wafer have no relative positional deviation (such a reference position can be determined by trial printing, for example, after the mask is set) and by calculating $\Delta\sigma w$ in accordance with the above-described equation while using the detected shift as the displacement $\Delta\delta w$, it is possible to determine the positional deviation between the mask and the wafer.

On the other hand, there are cases in which, in addition to the (1, −1, 0)-th order light described above, (0, −1, 1)-th order light which is different in diffraction order is nearly focused on the detection surface 39. More specifically, the (0, −1, 1)-th order light is such light as: having been inputted to the mask alignment mark 3M; having been transmitted therethrough at zero-th order; having been reflectively diffracted at negative first order by the wafer alignment mark 4W and influenced by the concave power (diversion) function; further having been transmissively diffracted at positive first order by the mask alignment mark 3M and influenced by the convex power (convergence) function; and nearly focused on the detection surface 39.

FIG. 2 schematically shows propagation of an input light AL, a (1, −1, 0)-th order light L1 and a (0, 1, 1-th order light L2 as well as an optical arrangement.

Here, generally, between the (1, −1, 0)-th order light and the (0, −1, 1)-th order light, there is a difference in magnification of displacement of the position of incidence to the relative positional deviation of the mask and the wafer. This leads to that, if such a point that, when in the detection surface a position vector of each point in the detection surface is multiplied by the light intensity of that point and the thus obtained products are integrated over the entire detection surface, the integrated value has a "zero vector" (hereinafter such a point will be referred to as "gravity center" of the light), is taken as the position of incidence of the light, the detection of positional deviation is affected by the $(0, -1, 1)$-th order light, in addition to the $(1, -1, 0)$-th order light which is the signal light. This precludes enhanced precision of deviation detection.

Further, when there is a wafer process factor such as a change in thickness of a resist film, for example, or any change in the relative position of the objects, to be aligned, in a direction perpendicular to a particular direction in which the positional deviation is to be detected, the ratio of intensity of these lights changes with such a change. This results in a change in the overall deviation detecting magnification of the $(1, -1, 0)$-th order light and the $(0, -1, 1)$-th order light and, therefore, it causes an error in the deviation detection.

SUMMARY OF THE INVENTION

It is accordingly a primary object of the present invention to provide an improved positional deviation detecting method, by which enhancement of detection precision is ensured.

In accordance with a first aspect of the present invention, to achieve this object, there is provided a method of detecting relative positional deviation of a first object with a first grating pattern having an optical power and a second object with a second grating mark having an optical power; wherein light diffracted by both the first and second grating marks forms a light pattern on a predetermined plane; wherein different diffraction beams of the light diffracted by both the first and second grating marks are displaceable along the predetermined plane in accordance with the relative positional deviation of the first and second objects, in the same direction and by substantially the same quantity; and wherein the relative positional deviation of the first and second objects is detected on the basis of the position of the light pattern on the predetermined plane.

In accordance with a second aspect of the present invention, there is provided a method of detecting relative positional deviation of a first object with a first grating mark having an optical power and a second object with a second grating mark having an optical power; wherein light diffracted by both the first and second grating marks forms a light pattern on a predetermined plane; wherein different diffraction beams of the light diffracted by both the first and second grating marks are superposed one upon another to form the light pattern which is displaceable along the predetermined plane in accordance with the relative positional deviation of the first and second objects while centers of the diffraction beams are held substantially coincident with each other; and wherein the relative positional deviation of the first and second objects is detected on the basis of the position of the light pattern on the predetermined plane.

In accordance with a third aspect of the present invention, there is provided a method of detecting relative positional deviation of first and second objects, wherein the first object is provided with a first grating mark having an optical power while the second object is provided with a second grating mark having an optical power; wherein light diffracted by both the first and second grating marks forms a light pattern on a predetermined plane; wherein different diffraction beams of the light diffracted by both the first and second grating marks ar superposed one upon another with their centers substantially coinciding with each other to form the light pattern; wherein the diffraction beams are displaceable along the predetermined plane in accordance with the relative positional deviation of the first and second objects, in the same direction and by substantially the same quantity; and wherein the relative positional deviation of the first and second objects is detected on the basis of the position of the light pattern on the predetermined plane.

In the present invention, displacement of the light pattern along the predetermined plane may be detected on the basis of at least one of a gravity center position and a peak position of an intensity distribution of the light pattern. The different diffraction beams each may preferably comprise a light beam having a sectional intensity distribution which is symmetric with respect to the beam center, and preferably it has a Gaussian distribution.

The first and second objects may be disposed close to each other or in an optically conjugate relationship. A radiation beam may be projected from above to the first object and the predetermined plane may be set above the first object. When in this situation the different diffraction beams are provided by (i) negative first order diffraction light produced as a result of reflective diffraction by the second grating mark of positive first order diffraction light from the first grating mark and (ii) positive first order diffraction light produced as a result of diffraction by the first grating mark of negative first order diffraction light, resulting from reflective diffraction by the second grating mark or, alternatively, when the different diffraction beams are provided by (i) positive first order diffraction light produced as a result of reflective diffraction by the second grating mark of negative first order diffraction light from the first grating mark and (ii) negative first order diffraction light produced as a result of diffraction by the first grating mark of positive first order diffraction light, resulting from reflective diffraction by the second grating mark, and if the different diffraction beams used are those each having been diffracted by the first grating mark only once and diffracted by the second grating mark only once, a light pattern having increased strength is obtainable. However, the different diffraction beams may be those beams having been diffracted twice by the first grating mark and diffracted once by the second grating mark. Further, the order of diffraction is not limited to the described, and positive and negative second orders, positive and negative third orders or the like may be used.

The present invention is effectively usable in the detection of positional deviation of a mask and a wafer in a semiconductor device manufacturing method and apparatus. This is because: in the positional deviation detecting method based on displacement of a light beam diffracted by plural grating marks, the simple grating mark and detecting system arrangement assures displacement of the light beam of a quantity equal to magnified positional deviation, being magnified several times or several tens of times, and therefore, extraordinarily high resolution is obtainable.

Accordingly, in another aspect of the present invention, related to the third aspect of the invention described above, there is provided an exposure apparatus usable with a mask provided with a circuit pattern and a first grating mark having an optical power and a wafer provided with a second grating mark having an optical power, for exposing the wafer to the pattern of the mask, said apparatus comprising: first holding means for holding the mask; second holding means for holding the wafer; driving means for relatively moving said first and second holding means an alignment system cooperable with the first and second grating marks of the mask and the wafer and including a light source and a detector, wherein light from said light source is diffracted by both the first and second grating marks and different diffraction beams of the light diffracted by both the first and second grating marks are superposed one upon another with their centers substantially coinciding with each other, to form a light pattern upon said detector, and wherein the diffraction beams are displaceable on said detector in accordance with a relative positional deviation of the mask and the wafer, in the same direction and by substantially the same quantity; control means for controlling said driving means on the basis of a position of the light pattern on said detector, to adjust the relative position of the mask and the wafer; and exposing means for exposing the wafer to the circuit pattern of the mask.

In accordance with a further aspect of the present invention, related to the third aspect of the invention described above, there is provided a method of manufacturing semiconductor devices by transferring a circuit pattern of a mask to a wafer and by processing the wafer, wherein the mask is provided with a first grating mark having an optical power while the wafer is provided with a second grating mark having an optical power; wherein light diffracted by both the first and second grating marks forms a light pattern on a predetermined plane; wherein different diffraction beams of the light diffracted by both the first and second grating marks are superposed one upon another with their centers substantially coinciding with each other to form the light pattern wherein the diffraction beams are displaceable along the predetermined plane in accordance with a relative positional deviation of the mask and the wafer, in the same direction and by substantially the same quantity; wherein the relative positional deviation of the mask and the wafer is detected on the basis of the position of the light pattern on the predetermined plane; and wherein the wafer is exposed to the circuit pattern of the mask with the relative positional deviation being corrected.

The wafer processing may include a step necessary for manufacture of semiconductor devices such as, for example, a developing process, an etching process, another pattern transfer process or the like.

As a matter of course, in the first or second aspect described above, the present invention is applicable to a semiconductor device manufacturing method and apparatus, as in the third aspect of the invention.

A mark usable in the present invention may be equipped with a grating pattern having an optical power (a convex or concave lens function or a convex or concave mirror function) at least with respect to a direction in which the positional deviation is to be detected. If desired, a mark which comprises a grating pattern having an optical power both in the deviation detecting direction and a direction perpendicular thereto, may be used. An example of such a grating pattern is a Fresnel zone plate.

Examples of radiation beams usable for exposure in the exposure apparatus or the manufacturing method, described above, are light of g-line or i-line, an excimer laser beam and X-rays.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be explained in detail. On an object surface A, first and second (signal producing) alignment marks A1 and A2 each having a function of a physical optic element, are formed. Also, on another object surface B, first and second (signal producing) alignment marks B1 and B2 similarly each having a function of a physical optic element, are formed. Light is inputted to the alignment mark A1, and diffraction light caused thereby is inputted to the alignment mark B1. Reflectively diffracted light from the alignment mark B1 is received by a sensor surface, and the gravity center of the received light on the sensor surface is detected by a first detecting means, as the position of incidence of the first light.

Here, the term "gravity center of light" means such a point that, when on the light receiving surface a position vector of each point on the surface is multiplied by the light intensity of that point and the thus obtained products are integrated over the entire surface, the integrated level has a "zero vector". However, as an alternative, the position of a peak point of the light intensity may be detected. Similarly, light is inputted to the alignment mark A2, and diffraction light caused thereby is inputted to the alignment mark B2. Gravity center of reflectively diffracted light from the alignment mark B2, on a receiving surface, is detected by a second detecting means as the position of incidence of the second light. By using two data from the first and second detecting means, the positioning of the objects A and B is executed. Here, the alignment marks A1, A2, B1 and B2 are so set that the gravity center position of the light incident on the first detecting means and the gravity center position of the light incident on the second detecting means shift in opposite directions in response to a positional deviation between the objects A and B.

Figure 3:
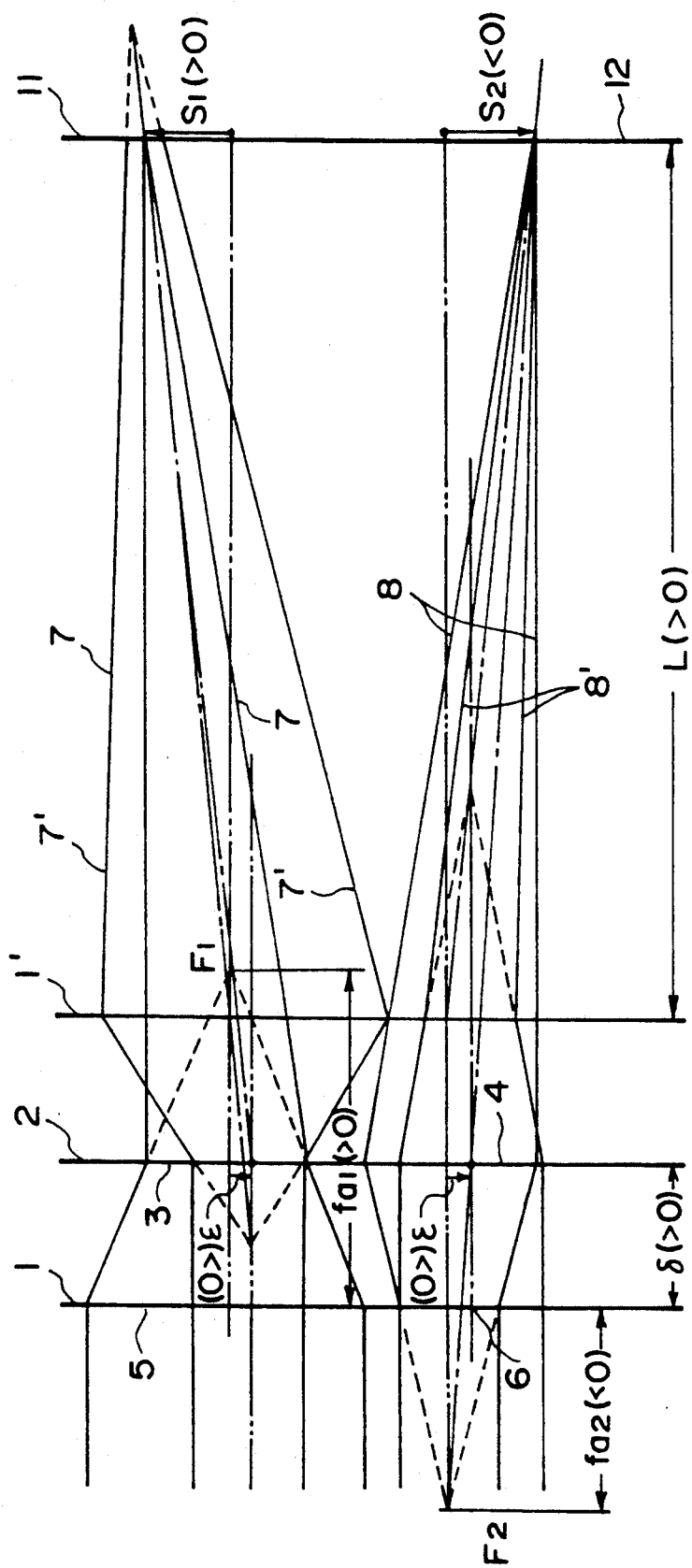
FIG. 3 is a schematic view, for explaining the principle of a position detecting system according to an embodiment of the present invention.
Figure 4:
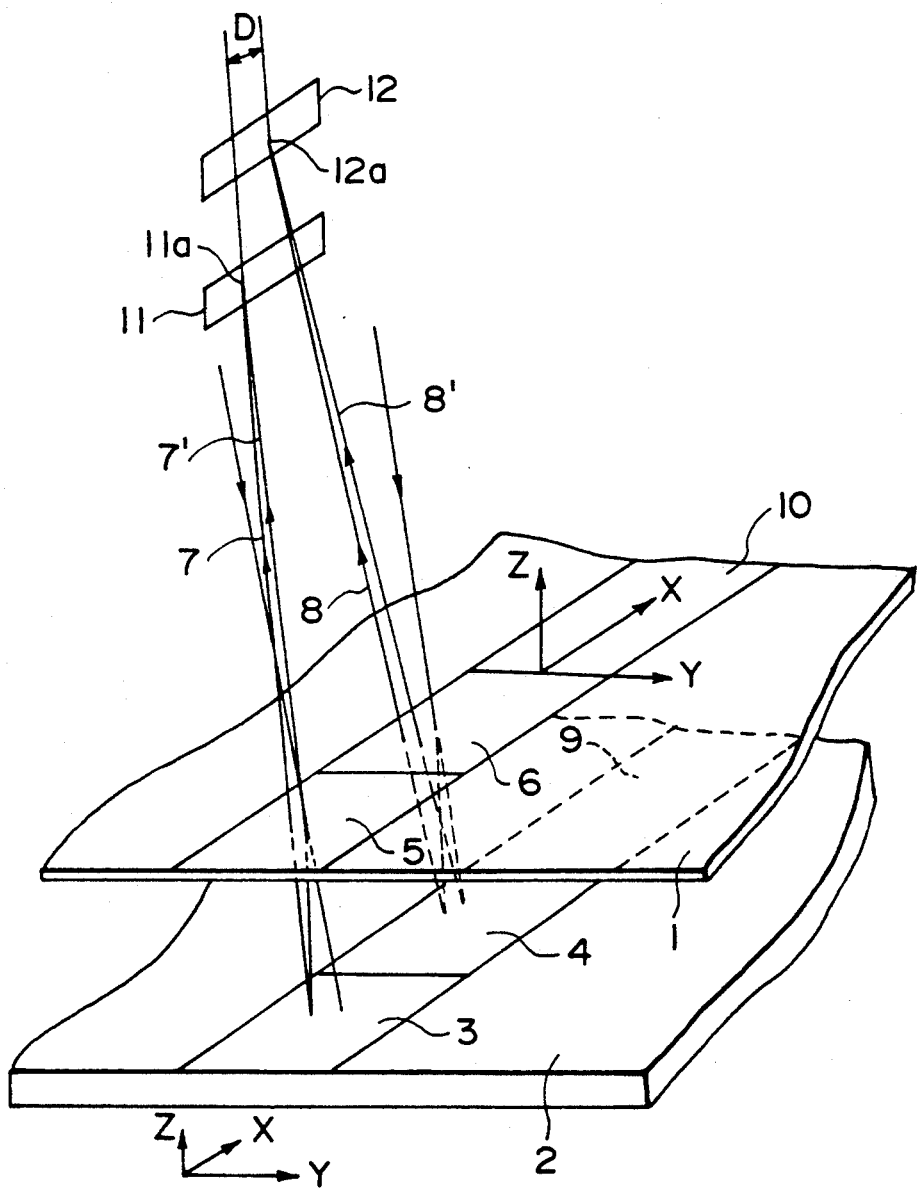
FIG. 4 is a schematic view of a major part of a position detecting system according to an embodiment of the present invention.

Referring now to FIGS. 3 and 4, the principle and structure of a first embodiment of the present invention will be explained. FIG. 3 illustrates the principle of this embodiment. Denoted at 1 is a first object (object A); denoted at 2 is a second object (object B); and denoted at 5 and 3 are alignment marks (marks A1 and B1) for obtaining the first light. These marks are provided on the first and second objects 1 and 2, respectively. Similarly, denoted at 6 and 4 are alignment marks (marks A2 and B2) for obtaining the second light. Similarly, these marks are provided on the first and second objects 1 and 2, respectively. Each of the alignment marks 3-6 can serve as a physical optic element, having a one-dimensional or two-dimensional lens function at least with respect to a direction in which the positional deviation is to be detected. In the drawing, for convenience, the paths are illustrated with the reflection type alignment marks 3 and 4 replaced by transmission type marks equivalent thereto. Reference numerals 7 and 8 denote the first and second alignment signal lights described hereinbefore. Denoted at 11 and 12 are first and second detecting means for detecting the first and second signal lights, respectively. For convenience in explanation, the optical distances from the object 2 have the same length L. Further, g denotes the distance between the first and second objects 1 and 2; $f_{a1}$ and $f_{a2}$ denote the focal lengths of the alignment marks 5 and 6; denotes the relative positional deviation of the object 2 relative to the object 1; $S_1$ and $S_2$ denote displacements of the gravity center positions on the first and second detecting means, respectively, at that time, from the positions assumed under correct alignment; and $F_1$ and $F_2$ denote the focal points of the alignment marks 5 and 6. Conveniently, the alignment light inputted to the object 1 is parallel light having a plane wavefront. The signs are such as illustrated.

The opposability in direction of the displacements $S_1$ and $S_2$ of the gravity centers of these lights, responsive to a relative positional deviation of the objects 1 and 2, is attainable by applying an inversive relationship to the signs of the optical imaging magnification of the alignment marks 3 and 4.

FIG. 4 is a schematic view of a major part of a position detecting system according to the first embodiment of the present invention, suitably usable in a semiconductor device manufacturing exposure apparatus. Like numerals as these of FIG. 3 are assigned to corresponding elements.

In FIG. 4, denoted at 1 is a first object which is a mask, for example. Denoted at 2 is a second object which is a wafer, for example, to be aligned with the mask 1. Alignment marks 3 and 4 and alignment marks 5 and 6 each is provided by a grating lens which comprises, as an example, a one-dimensional or two-dimensional Fresnel zone plate having a power at least in the X-axis direction. These marks are formed on scribe lines 9 and 10 on the wafer 2 surface and the mask 1 surface, respectively. Denoted at 7 is (1, −1, 0)-th order light of the first light; denoted at 7' is (0, −1, 1)-th order light of the first light; denoted at 8 is (−1, 1, 0)-th order light of the second light; and denoted at 8' is (0, 1, −1)-th order light of the second light. These lights 7, 7', 8 and 8' are produced as a result of irradiation of the first and second objects with light, projected from a light source of an alignment head (not shown) and collimated into a predetermined beam diameter.

In this embodiment, examples that can be used as a light source are: a light source such as a semiconductor laser, a He-Ne laser, an Ar laser or the like that can emit a coherent light; and a light source such as a light emitting diode or the like that can emit an incoherent light. Sensors (photoelectric transducers) 11 and 12 function as first and second detecting means, respectively, and they are adapted to receive the lights 7 and 8. Each of these sensors may comprise a one-dimensional CCD sensor, for example, having light sensing elements arrayed in a direction coinciding with the X-axis direction.

In this embodiment, the lights 7 and 8 are those lights: as having been incident upon the alignment marks 5 and 6, respectively, on the mask 1 surface each at a predetermined angle; having been transmissively diffracted by these marks and then reflectively diffracted by the alignment marks 3 and 4 on the wafer 2 surface, respectively; and having been simply transmitted through the mask 1. On the other hand, the lights 7' and 8' are those lights: as having been simply transmitted through the mask 1; having been reflectively diffracted by the alignment marks 3 and 4 on the wafer 2 surface, respectively; and having been transmissively diffracted by the alignment marks 5 and 6 on the mask 1 surface. The lights 7 and 7' are incident on the sensor 11 surface, while the lights 8 and 8' are incident on the sensor 12 surface. The lights 7 and 7' provide the first light, while the lights 8 and 8' provide the second light. The sensors 11 and 12 serve to detect the gravity center positions of the first and second lights, respectively, incident on the respective sensor surfaces. By using output signals from the sensors 11 and 12, any positional deviation of the mask 1 and the wafer 2 can be detected.

Description will now be made of the alignment marks 3-6.

The alignment marks 3-6 are provided by Fresnel zone plates (or grating lenses) having different focal lengths. Practical size of each mark is 50-300 microns in the lengthwise direction of scribe line 9 or 10 and 20-100 microns in the widthwise direction (Y-axis direction) of the scribe line.

In this embodiment, all the lights 7, 7', 8 and 8' are incident on the mask 1 at an angle of incidence of about 17.5 degrees in the Y-Z plane, with the projection upon the mask 1 surface being perpendicular to the scribe line direction (X-axis direction). The mask 1 and the wafer 2 are spaced from each other by a gap of 30 microns. The (1, −1, 0)-th order light 7 of the first light has been transmissively diffracted at first order by the alignment mark 5 and influenced by the convex lens function and, then, influenced by the concave lens function of the alignment mark 3 on the wafer 2 surface and, thereafter, it is focused at a point on the sensor 11 surface of the first detecting means.

On the other hand, the (0, −1, 1)-th order light 7' of the first light has been transmitted (diffracted) at zero-th order through the mask 1 surface and then reflectively diffracted at first order by the mark 3 on the wafer 2 surface and influenced by the convex lens function, and thereafter, transmissively diffracted at first order by the mark 5 on the mask 1 surface and influenced by the concave lens function, and finally it impinges on the sensor 11 surface.

On the sensor 11 surface, displacement of the position of incidence of this first light corresponds to the quantity of positional deviation between the alignment marks 5 and 3 in the X-axis direction, namely, the quantity of misalignment of the axes of them. Also, the first light is inputted, bearing a magnified quantity of positional deviation. As a result of this, the shift of the gravity center position of the inputted light is detected by the sensor 11.

The present embodiment is so set that, when the mask 1 and the wafer 2 have no relative positional deviation (i.e., when the alignment marks 5 and 3 on the mask 1 and the wafer 2 just provide a coaxial system), the chief ray of the light 7 emitted from the wafer 2 has an angle of emission of 13 degrees, and the projection of the emitted light upon the wafer 2 surface extends perpendicularly to the lengthwise direction (X-axis direction) of the scribe line, and the light 7 is focused on the sensor 11 surface which is disposed at a predetermined position, for example, at a height of 18.657 mm from the wafer 2 surface.

On the other hand, the lights 8 and 8' are emitted so that, as a result of the transmissive diffraction by the alignment mark 6 and the reflective diffraction by the alignment mark 4 on the wafer 2 surface, the spot position at the imaging point displaces in a direction different from that of the lights 7 and 7', and also they are emitted with an angle of emission of 7 degrees, from a site different from that of the lights 7 and 7', with the projection upon the wafer 2 surface being perpendicular to the lengthwise direction of the scribe line, as there is no positional deviation, and they are focused upon the sensor 12 surface of the second detecting means.

In the present embodiment with the lens parameter setting of the alignment marks as described, the X-axis component of the interval, i.e., the spacing along the X-axis direction, between (i) the gravity center position of the overall light intensity distribution of a light pattern as formed on the sensor 11 surface by the two lights 7 and 7' and (ii) the gravity center position of the overall light intensity distribution of the light pattern as formed on the sensor 12 surface by the two lights 8 and 8', is detected. The quantity of change in the X-axis direction of the gravity center position upon each sensor is proportional to the quantity of positional deviation in the X-axis direction between the mask and the wafer, and the direction of change is opposite to that of the other. Therefore, the quantity of change in interval between the gravity center positions along the X-axis direction as a positional deviation occurs between the mask and the wafer, is proportional to the quantity of relative positional deviation of the mask and the wafer in the X-axis direction, and the magnification thereof corresponds to the sum of the magnifications of the displacements of the gravity center positions. As an example, if the magnifications of displacements of the gravity center positions are $+100\times$ and $-100\times$, then the magnification of the quantity of change in interval (i.e. the positional deviation detecting magnification) is equal to $200\times$. Reference interval D between the gravity center positions along the X-axis direction to be defined as the mask and the wafer have no relative positional deviation with respect to the X-axis direction, can be determined beforehand by calculations using design values or by trial printing. During actual detection of the relative positional deviation of the mask and the wafer in the X-axis direction, the interval between the gravity center positions in the X-axis direction is compared with the reference interval D and, from a difference therebetween and in accordance with the magnification of the quantity of change in interval described above, the quantity of relative positional deviation of the mask and the wafer in the X-axis direction is calculated.

As described hereinbefore, in addition to the (1, $-1$, 0)-th order light 7 diffracted between the first and second objects, as the positional deviation signal light, there is a (0, $-1$, 1)-th order light 7' which is nearly focused upon the detection surface 11 in a similar manner, and thus both the (1, $-1$, 0)-th order light and the (0, $-1$, 1)-th order light are received by the detection surface 11. Accordingly, the quantity of displacement of the gravity center position on the detection surface is approximately given by the following equation:

$$S_1 = (a_1 S_{11} + a_{21} S_{21})/(a_{11} + a_{21})$$

wherein $S_{11}$ and $S_{21}$ denote individual displacements of the gravity center positions of the (1, $-1$, 0)-th order light and the (0, $-1$, 1)-th order light upon the detection surface, respectively, and $a_{11}$ and $a_{21}$ are weighting factors corresponding to the light intensities of these lights upon the detection surface. Also, $S_{11}$ and $S_{21}$ are given by:

$$S_{11} = [-L/(f_{a1}-g)]\epsilon$$

$$S_{21} = [L'/(f_{b1}-g)]\epsilon$$

wherein $f_{a1}$ and $f_{b1}$ are focal lengths of the alignment marks 5 and 3, respectively, and L and L' are the distances to the detection surface from the alignment marks 5 and 3, respectively.

In the first embodiment, the same magnification is given to the displacements $S_{11}$ and $S_{12}$, to the relative positional deviation of the mask and the wafer in the X-axis direction. With this arrangement, the gravity center position of the (1, $-1$, 0)-th order light 7 and the gravity center position of the (0, $-1$, 1)-th order light 7, upon the detection surface 11, substantially coincide with each other. Therefore, even if the ratio in light intensity of these lights changes in dependence upon the positional relationship between the mask and the wafer, for example, the gravity center position on the detection surface 11 is substantially unchanged.

In this manner, any change in the ratio of light intensity, on the detection surface, between two lights 7 and 7' diffracted in different manners, is accepted and, by doing so, stabilization of the detection precision is assured. For providing the same magnification to the displacements $S_{11}$ and $S_{12}$, to a deviation $\epsilon$, there is a condition such as follows:

$$1 - L/(f_{a1}-g) = L'/(f_{b1}-g)$$

Accordingly, by setting the focal lengths $f_{a1}$ and $f_{b1}$ of the first and second alignment marks 5 and 3 so as to satisfy:

$$f_{b1} = L'(f_{a1}-g)/(f_{a1}-g-L) + g \qquad (1),$$

the overall magnification as described can be maintained constant even if there occurs a change in the ratio of light intensity between the (1, $-1$, 0)-th order light 7 and the (0, $-1$, 1)-th order light 7'.

Similarly, on the detection surface 12, in addition to the ($-1$, 1, 0)-th order light 8 diffracted between the first and second objects, as the signal light, there is a (0, 1, $-1$)-th order light 8' nearly focused on that detection surface. In order to assure that the displacement $S_2$ of the gravity center position on the detection surface is not affected by any change in the ratio of light intensity between these two lights, like the case of $S_1$ described above, the focal lengths $f_{b2}$ and $f_{a2}$ of the alignment marks 4 and 6 are set so as to satisfy:

$$f_{b2} = L'(f_{a2}-g)/(f_{a2}-g-L) + g \qquad (2)$$

With this setting, it is ensured that, irrespective of a change in the ratio of light intensity between the lights 7 and 7' or between the lights 8 and 8', the quantity of change ($\Delta D$) in the interval between the gravity center positions in the X-axis direction, from the reference interval D, which corresponds to the sum of $S_1$ and $S_2$, always has a constant magnification relative to a deviation $\epsilon$. Here, between $\Delta D$ and $\epsilon$, there is a relationship as can be expressed by:

$$\Delta D = |[1-L/(f_{a1}-g)]-[1-L/(f_{a2}-g)]|\epsilon$$

In this embodiment, lens parameters are so set that the detection sensitivities of displacements $S_1$ and $S_2$, to a relative positional deviation $\epsilon$, have opposite signs. To this end, it is necessary that the focal lengths $f_{a1}$ and $f_{a2}$ of the alignment marks 5 and 6 satisfy the following relationship:

$$[1-L/(f_{a1}-g)][1-L/(f_{a2}-g)] < 0$$

In a particular example according to this embodiment, L = 18.657 mm, g = 30 microns, $f_{a1}$ = 214.7228 microns, and $f_{a2}$ = −158.4545 microns. In this connection, for providing the same positional deviation detecting magnification to the (1, −1, 0)-th order light, the (0, 1, 1)-th order light, the (−1, 1, 0)-th order light and the (0, 1, −1)-th order light, in equations (1) and (2), L' ÷ 18.627 mm and the focal lengths $f_{b1}$ and $f_{b2}$ of the alignment marks 3 and 4 are $f_{b1}$ = −156.270 microns and $f_{b2}$ = 216.216 microns.

In this embodiment, as described, the marks 5 and 3 are provided by physical optic elements which function as a convex lens and a concave lens, respectively. Also, the marks 6 and 4 function as a concave lens and a convex lens, respectively. As a result, displacements $S_1$ and $S_2$ of the signal lights, in a system provided by alignment marks 5 and 3 and in a system provided by alignment marks 6 and 4, responsive to a relative deviation $\epsilon$ of two objects 1 and 2, are in opposite directions.

The arrangement in which two signal lights displace in opposite directions has an advantage that: even if the precision of setting the gap g between two objects 1 and 2 is lowered, the magnifications (deviation magnifications) $\beta_1$ and $\beta_2$ of displacements $S_1$ and $S_2$ to $\epsilon$, necessary for calculation of the positional deviation, are in a mutually compensatory relationship, in two optical paths, wherein $$\beta_1 = 1-L/(f_{a1}-g) \text{ and } \beta_2 = 1-L/(f_{a2}-g)$$

Namely, under the lens parameters described above, if, for example, the gap g between the objects 1 and 2 is enlarged from 30 microns to 33 microns, $\beta_1$ changes from −100 to −101.684 while $\beta_2$ changes from +100 to +98.464. Accordingly, the overall magnification $|\beta_1 - \beta_2|$, to be used for calculation of the positional deviation changes from 200 to 200.148, and in terms of proportion it can be said that the change in magnification is reduced to 0.0741%. This means that the respective changes in the signals of 1.68% and 1.53% are suppressed to about 1/20. Thus, in an application to such a system wherein the gap setting is not so easy, directly this provides an advantage of enlargement of tolerance for the gap setting during the positional deviation detection, or an advantage of enhancement of the detection precision.

Another advantage is that an error attributable to inclination of the second object 2 can be compensated for in principle.

Figure 1:
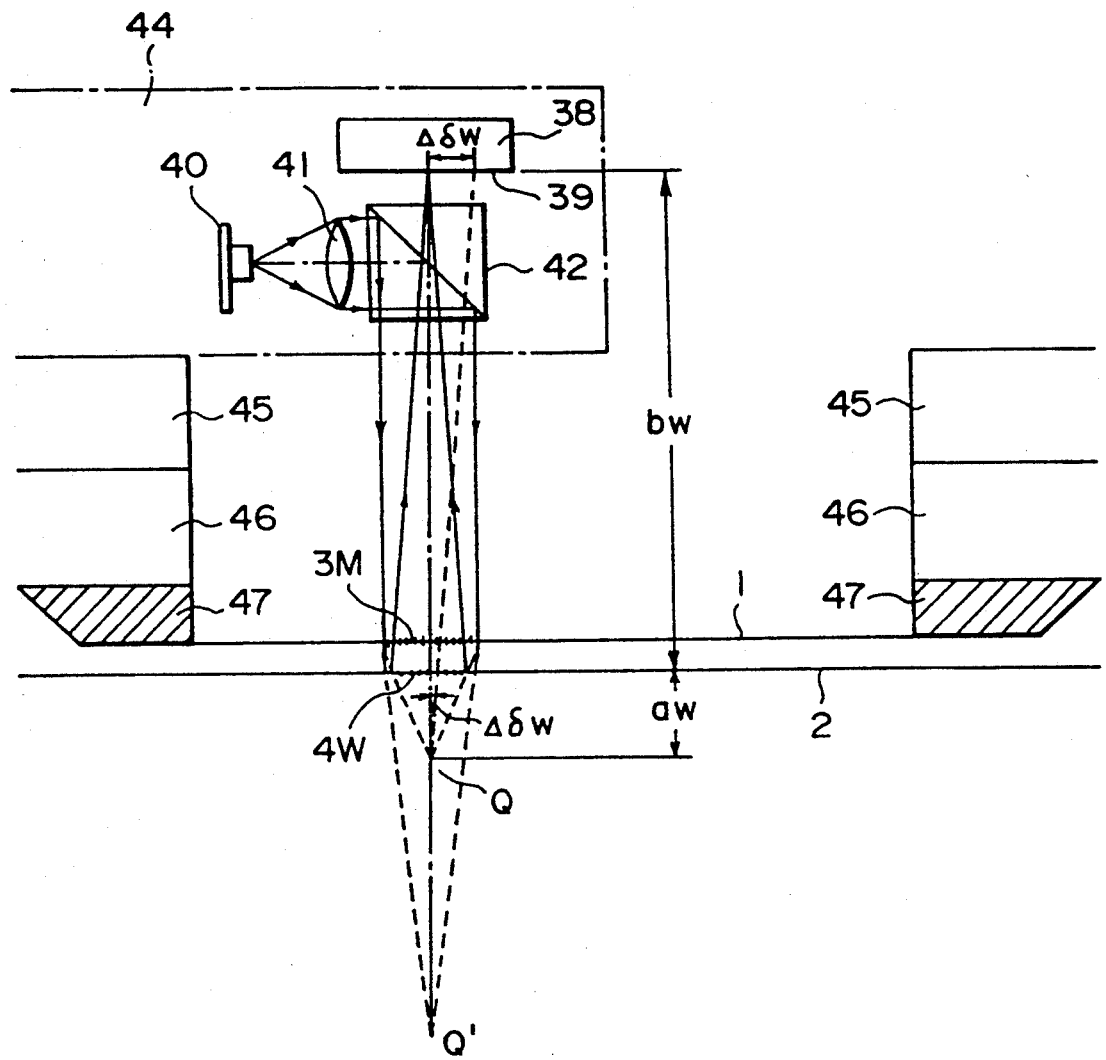
FIG. 1 is a schematic view of a general arrangement of a known type position detecting system.
Figure 2:
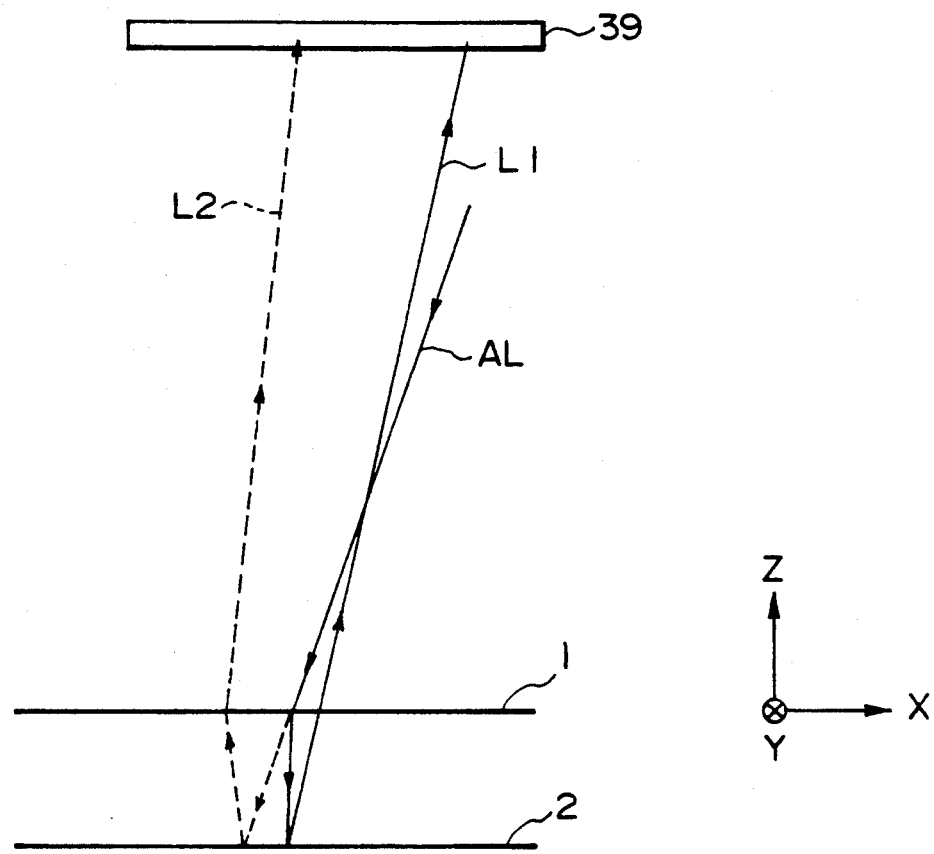
FIG. 2 is a schematic view, showing an example of optical paths for the $(1, -1, 0)$-th order light and the $(0, -1, 1)$-th order light.

If, in this embodiment, the wafer 2 surface is inclined in the X-Z plane in FIG. 2 (i.e., the wafer surface moves rotationally about an axis parallel to the Y-axis) by an amount 1 mrad, there occurs on the sensor 11 a displacement of about 37.3 microns of the gravity center of the lights 7 and 7'. On the other hand, the second signal lights 8 and 8' have a symmetrical plane with the signal lights 7 and 7', parallel to the Y-Z plane and, additionally, they travel along respective optical paths having the same length. And, on the sensor 12, there occurs displacement of the gravity center of exactly the same quantity as the signal lights 7 and 7'. Thus, if the signals from the sensors 11 and 12 representing the effective gravity center positions are processed so as to detect and output a difference therebetween, an obtained signal would not change even if the wafer 2 surface is inclined in the Y-Z plane.

If, on the other hand, the wafer 2 is inclined in the Y-Z plane, i.e., when the wafer 2 surface rotationally moves about an axis parallel to the X-axis, each of the signal lights 7, 7', 8 and 8' causes gravity center displacement in the widthwise direction (Y-axis direction) of the sensor 11 or 12, perpendicular to the lengthwise direction (X-axis direction) thereof. However, such a displacement lies in the direction which is perpendicular to the direction of displacement of the gravity center of the light responsive to the positional deviation (which is just to be detected on the sensor 11 or 12). Therefore, practically no alignment error occurs.

Further, when an alignment head which may accommodate an alignment light source, a light projecting lens system and sensors, is shifted relative to a mask-and-wafer system, the positions of th first and second lights incident upon the sensors 11 and 12, respectively, displace in the same manner. If, for example, the head is displaced by 5 microns in the Y-axis direction relative to the mask, there occurs an effective displacement of the gravity center of the first light, on the sensor 11 surface, by an amount of 5 microns. On the other hand, the gravity center of the second light displaces exactly by the same amount of 5 microns.

Accordingly, with inclination of the wafer surface or a change in position of the head, no change occurs in the final output of the sensor system, namely, in the signal corresponding to the positional deviation of the first and second object. Thus, stabilization of th detection precision is assured.

By providing the same positional deviation detecting magnification to the (1, −1, 0)-th order light 7 and the (0, −1, 1)-th order light 7' or to the (−1, 1, 0)-th order light 8 and the (0, 1, −1)-th order light 8', as described hereinbefore, it is possible to suppress a change in the overall positional deviation detecting magnification due to a change in ratio of light intensity of these lights.

As a factor that causes a change in the ratio of light intensity, there is a change in the relative position of a mask and a wafer in the mask-to-wafer interval direction (Z-axis direction) or a direction (Y-axis direction) perpendicular to the deviation detecting direction (X- axis direction). For example, when the mark size is 90 microns in the deviation detecting direction (i.e. in the lengthwise direction of the scribe line 9 or 10 in this example) and 50 microns in the widthwise direction of the scribe line (perpendicular to the deviation detecting direction), if there is a deviation of 10 microns in the widthwise direction of the scribe line as compared with the state in which no deviation is present in the widthwise direction of the scribe line, the ratio of light intensity between the (1, −1, 0)-th order light 7 and the (0, −1, 1)-th order light 7′ or between the (−1, 1, 0)-th order light 8 and the (0, 1, −1)-th order light 8′, upon the detection surface changes by 20%. With the present embodiment, however, the focal length of each alignment mark on the wafer 2 is optimized with respect to the focal length of a corresponding alignment mark on the mask 1 in accordance with equations (1) and (2). By this, it is possible to maintain a constant overall detection magnification.

A second factor for the change is that: due to a change in wafer process, in the first light, for example, the diffraction efficiency for the first order diffraction by the mark on the wafer 2 is different between the (1, −1, 0)-th order light 7 and the (0, −1, 1)-th order light 7′ and, as a result of this, the ratio of light quantity between these lights 7 and 7′ upon the sensor 11 changes. The effect of such a change on the overall detection magnification can be avoided by the optimization of the focal length of the alignment mark according to equations (1) and (2).

Figure 5A:
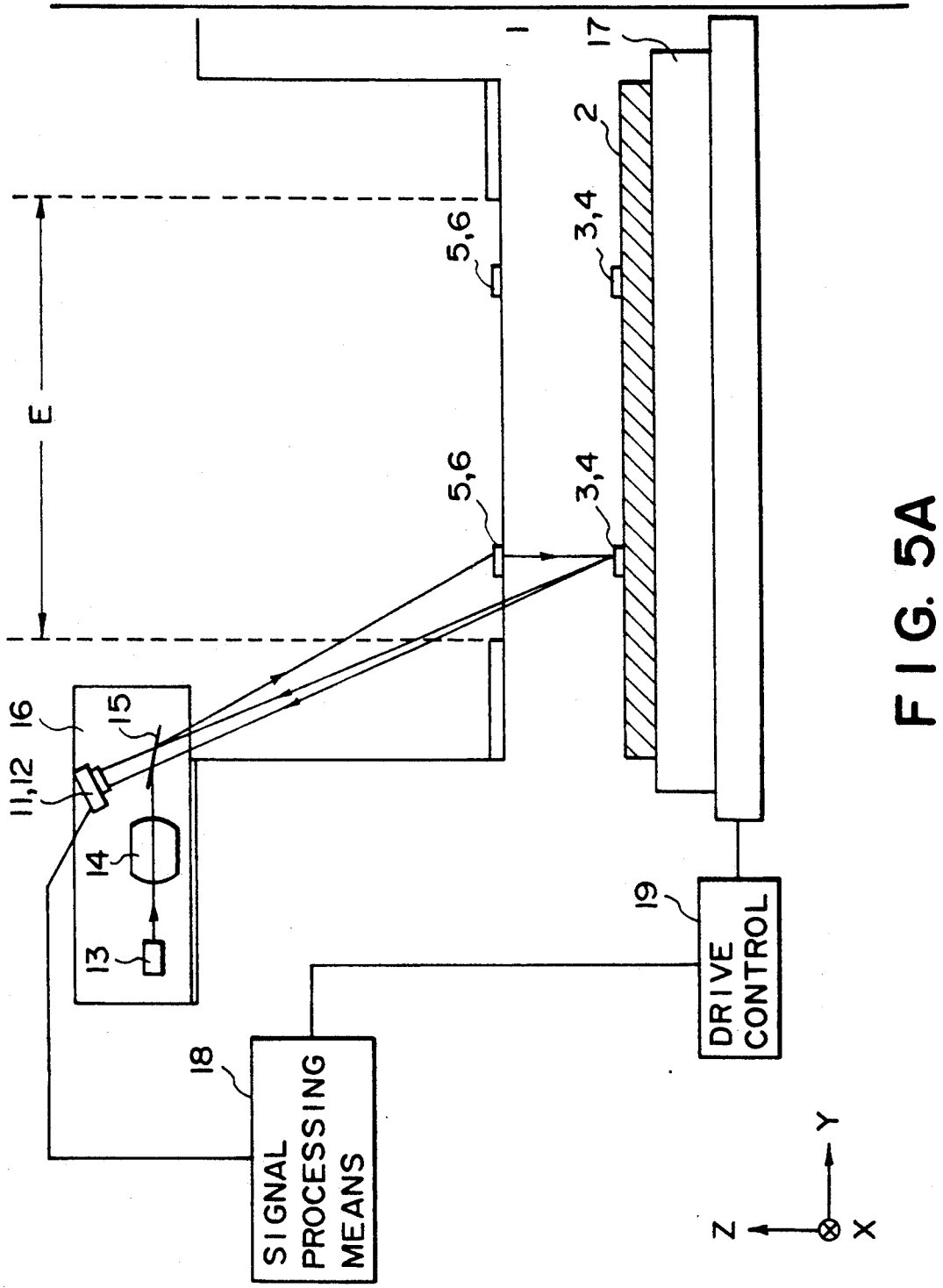
FIG. 5A is a schematic view of a peripheral part of a proximity type semiconductor device manufacturing apparatus according to a second embodiment of the present invention.

FIG. 5A shows the structure of a peripheral part of a proximity type semiconductor device manufacturing X-ray exposure apparatus of a second embodiment of the present invention, to which the position detecting system of the first embodiment is applied. Illustrated in this Figure, but not shown in FIG. 4, are a light source 13, a collimator lens (or a beam diameter transforming lens) 14, a projected light deflecting mirror 15, a pickup casing 16, a wafer stage 17, a positional deviation signal processing means 18 and a wafer stage drive controlling means 19. Reference character E depicts the width (range) of the exposure light which comprises X-rays in this example. Also in the present embodiment, any relative positional deviation between the mask 1 and the wafer 2 can be detected in a similar manner as has been described with reference to th first embodiment.

An alignment process to be adopted in this embodiment may be such as follows:

A first example is that: Signals representing displacements of gravity centers of the lights upon the detection surfaces of the sensors 11 and 12, corresponding to the positional deviation $\Delta\sigma$ between two objects, are detected and, in the signal processing means 18, the positional deviation $\Delta\sigma$ between these objects is detected on the basis of the signals representing the displacements of the gravity centers. Then, the stage drive control 19 operates to move the wafer stage 17 by an amount corresponding to the detected positional deviation $\Delta\sigma$.

A second example is that: From the signals outputted by the sensors 11 and 12, the signal processing means 18 detects such a direction that cancels the positional deviation $\Delta\sigma$. The stage drive control 19 operates to move the wafer stage 17 in that direction, and the above-described operations are repeated until the positional deviation $\Delta\sigma$ comes into a tolerable range.

Figure 5B:
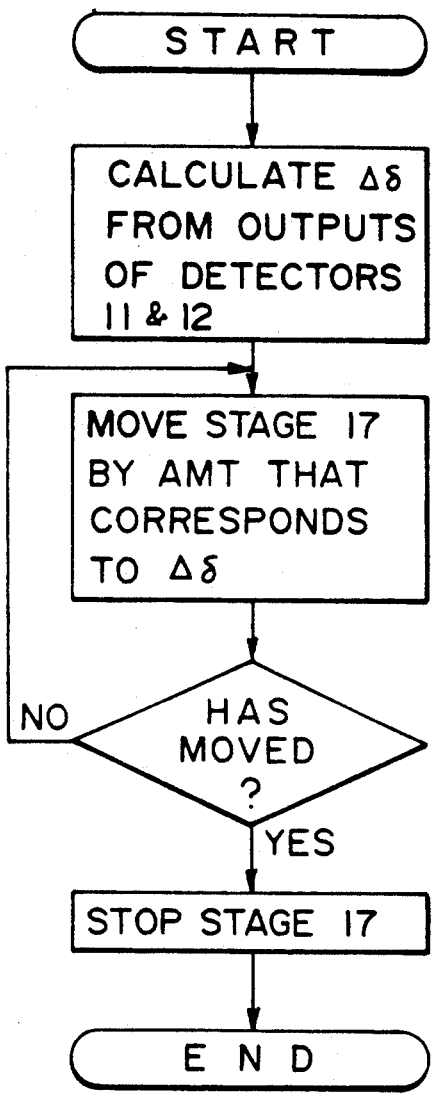
FIGS. 5B and 5C are flow charts, respectively, showing examples of an alignment process in the apparatus of FIG. 5A.
Figure 5C:
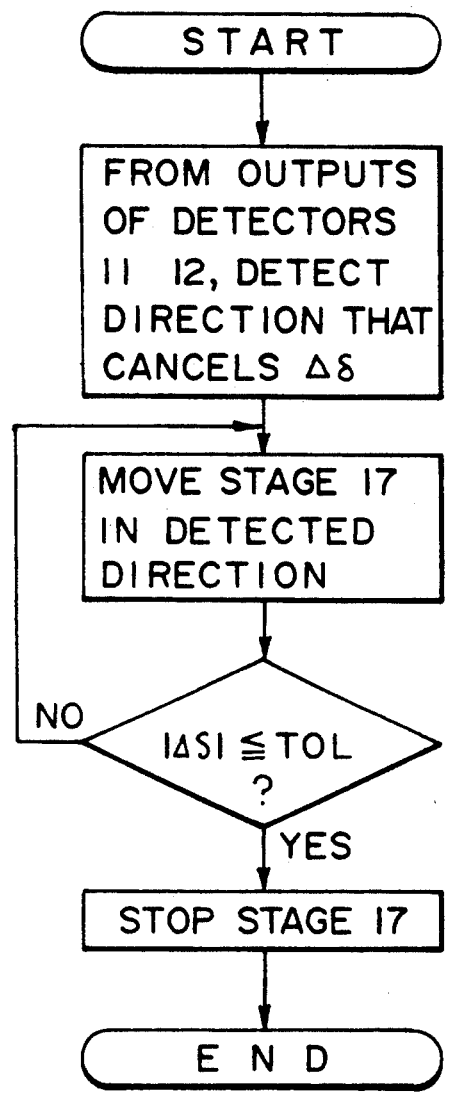

The above-described alignment procedures are illustrated in flow charts of FIGS. 5B and 5C, respectively.

It will be understood from FIG. 5A that the light source 13 projects light from outside of the path of the exposure light, and that the sensors 11 and 12 provided outside the exposure light flux E receive diffraction lights emanating from the alignment marks 3–6 outwardly of the exposure light flux E, for the position detecting purpose.

Thus, with the above structure, it is possible to provide a system having no necessity of retracting the pickup housing 16 at the time of exposure. Also in this embodiment, like the first embodiment, the focal lengths of the alignment marks 3–6 are optimized in accordance with equations (1) and (2).

A third embodiment of the present invention will now be explained. Since the major part of a position detecting system according to the third embodiment is essentially the same as that shown in FIG. 4, specific illustration thereof is omitted and the description will be made by reference to FIG. 4.

In the third embodiment of the present invention, like the first embodiment, the parameters are set so as to ensure: that the same magnification is given to the displacements $S_{11}$ and $S_{12}$ of the gravity center positions of the (1, −1, 0)-th order light 7 and the (0, −1, 1)-th order light 7′, to a positional deviation $\epsilon$; that the same magnification is given to the displacements of gravity center positions of the (−1, 1, 0)-th order light 8 and the (0, 1, −1)-th order light 8′, to the positional deviation $\epsilon$; that the first and second lights (7, 7′; 8, 8′) are sharply imaged on the sensors 11 and 12, respectively. Here, description will be made of the (1, −1, 0)-th order light 7 and the (0, −1, 1)-th order light 7′. According to a lens formula, in order that an image point of the alignment mark 5 (focal length $f_{a1}$) on the mask 1 is imaged by the alignment marks 3 (focal length $f_{b1}$) of the wafer 2 at a position (on the detection surface) of a distance L from the wafer 2 surface, the following relationship should be satisfied:

$$1/(f_{a1}-g) + 1/L = -1/f_{b1} \qquad (3)$$

Substituting equation (3) into equation (1) and assuming that $L' \doteq L - g$, it follows that:

$$L = [(f_{a1}-g)/g](2f_{a1}-3g) \qquad (4)$$

From this, it is seen that $f_{a1}$ may be set to satisfy:

$$f_{a1} = (5g \pm \sqrt{g^2 + 8gL})/4 \qquad (4')$$

For example, if g = 30 microns and L = 18.657 mm, then $f_{a1}$ = 566.57 microns or $f_{a1}$ = −491.57 microns. The magnification of $S_1$ to $\epsilon$ at this time is 35.60× or −36.77×.

Similarly, with regard to the (−1, 1, 0)-th order light 8 and the (0, 1, −1)-th order light 8′, $f_{a2}$ may be set to satisfy:

$$f_{a2} = (5g \pm \sqrt{g^2 + 8gL})/4 \qquad (4'')$$

Further, as a fourth embodiment, taking into account a magnification necessary for the positional deviation detection, the parameter L or g may be set so as to satisfy the imaging condition and the condition for providing the same magnification to the displacements $S_{11}$ and $S_{12}$ of the gravity center positions of the light (1, −1, 0)-th order light 7 and the (0, −1, 1)-th order light 7', to a positional deviation ε. For example, if the magnification of $S_1$ to ε is denoted by β, then $$\beta = 1 - L/(f_{a1}-g)$$

From this, it follows that $$f_{a1} = L/(1-\beta) + g \qquad (5)$$

Substituting equation (5) into equation (4), it follows that $$L = g(1-\beta)(2-\beta)/2 \qquad (6)$$

From this, when the exposure gap g is set as g =30 microns and the magnification β of $S_1$ to ε is set as β = +100×, it follows that:

$$L = 145.53 \text{ mm}$$

$$f_{a1} = -1.44 \text{ mm}$$

In this manner, by determining the lens parameters and the sensor setting positions in accordance with equations (5) and (6), it is possible to obtain an optical arrangement in which, in accordance with a predetermined "$S_1$/ε magnification", both the (1, −1, 0)-th order light 7 and the (0, −1, 1)-th order light 7' are imaged on the sensor. As a matter of course, in a similar manner, it is possible to obtain an optical arrangement wherein, in accordance with a predetermined "$S_2$/ε magnification", both the (−1, 1, 0)-th order light 8 and the (0, 1, −1)-th order light 8' are imaged on the sensor.

Next, for explanation of a fifth embodiment, a case is considered here wherein use is made of such light as having been transmissively diffracted at m-th order by an alignment mark of a mask, then having been reflectively transmitted at n-th order by an alignment mark of a wafer and finally having been transmissively diffracted at l-th order by the alignment mark of the mask. Namely, in this case, (m, n, l)-th order light is used as the positional deviation signal light. Particularly, in the fifth embodiment, it is assumed that m, n and l are integers and that at least one of them has an absolute value not less than 2.

In this example, each alignment mark comprises a one-dimensional or two-dimensional grating lens, and an X axis is laid in the direction in which the lens power is produced. A Y-axis is laid on an axis which passes the center of the alignment mark and intersects at a right angle with the X axis, within the plane in which the alignment mark is formed. Also a Z axis is laid on an axis perpendicular to the X and Y axes. When an input light is incident at an angle θ in the Y–Z plane, if the (m, n, l)-th order light as the same finally emanates from the mask surface has an angle ξl, then ξl is given by:

$$\sin\xi l = (\lambda/P_M)(l+m) - (\lambda/P_W)n - \sin\theta \qquad (7)$$

wherein $P_M$ and $P_W$ are pitches of the mask and wafer grating lenses, in the Y–Z plane, having no light converging or diverging function, and λ denotes the wavelength.

From equation (7), it follows that the lights to be inputted to the light detection surface at the same time should be, as a first example, those lights which correspond to such a combination of diffraction orders that satisfy:

$$l + m = k \text{ (constant)}$$

$$n = n_0 \text{ (constant)} \qquad (8)$$

that is, l-th order transmission lights having been transmitted at m-th order by the mask alignment mark and having an "l" satisfying equation (8) again. As for the positional deviation signal light, it is a necessary condition for the magnified deviation detection using grating lenses that n ≠ 0 and at least one of m and l is not equal to 0.

The fifth embodiment of the invention will be explained in detail. Since the major part of an apparatus according to the fifth embodiment or a further embodiment, to be described later, is substantially the same as that shown in FIG. 4, duplicate illustration will be omitted and the description will be made by reference to FIG. 4. Also, in the following description, only a pair of lights 7 and 7' will be explained. The following description will apply to another pair of lights 8 and 8'.

Particularly, the invention will be explained here with reference to a case wherein the invention is applied to such a combination of diffraction orders, wherein n = $n_0$ (≠ 0; constant) and one of m and l is equal to 0. Namely, the light diffracted once by a mask alignment mark and once by a wafer alignment mark, each at an order not less than 1 or not greater than −1, is considered. Also, a combination of diffraction orders which, under a condition of "n is constant and is not equal zero", is effective to avoid a large difference with respect to the positional deviation detecting magnification and in the position of final convergence point. Practically, diffraction lights other than those of such a combination do not form a spot of focused light on a sensor even if they satisfy equation (8) and, therefore, they do not have a substantial effect on the detection of positional deviation.

In the present embodiment, in consideration of the above, lens parameter setting is made so as to ensure the same magnification of deviation detection for both of the diffraction lights of (m, n, 0)-th order light and 0, n, m)-th order light, where m ≠0 and n ≠0. The (m, n, 0)-th order light and the (0, n, m)-th order light are in a relationship, satisfying equation (8). If m-th order diffraction light from a mask alignment mark 5 is used and the focal length of the alignment mark corresponding to this order is denoted by $f_m^M$, and if n-th order diffraction light from a wafer alignment mark 3 is used and the focal length is denoted similarly by $f_n^W$, then the relationship between $f_m^M$ and $f_n^W$ that assures the same detection magnification to the (m, n, 0)-th order light and the (0, n, m)-th order light, is given by the following equation, like the first embodiment:

$$f_n^W = L'(f_m^M - g)/(f_m^M - g - L) + g \qquad (9)$$

Next, a sixth embodiment of the invention will be considered. In this embodiment, the signal light is provided by (m, n, l)-th order light where m ≠0, n ≠0 and l ≠0, that is, such light diffracted twice by a mask and once by a wafer at an order not less than 1 and not greater than −1, is used.

Assuming now that the focal length of a mask alignment mark 5 corresponding to i-th order diffraction light is $f_i^M$ and similarly the focal length of a wafer alignment mark 3 corresponding to j-th order diffraction light is $f_j^W$, then, from the effective gravity center position of the (m, n, l)-th order light, the magnification $\beta'$ of the displacement of the gravity center position of this light upon the detection surface, to $\epsilon$, is given by:

$$\beta' = [1-L_1/(f_m^M-g)][L_2/(L_1-g)] \quad (10)$$

where L is given by:

$$1/f_m^M-g) + 1/L_1 = -1/f_n^W \quad (11)$$

and $L_2$ is the distance from the center of the mask mark to the center of the detection surface.

In this embodiment, like the fifth embodiment, each alignment mark comprises a grating lens having an optical power like that of a cylindrical lens, and the coordinate system is set in a similar manner. Taking into account equation (8), there is (l, n, m)-th order light in addition to the (m, n, l)-th order light, which reaches the sensor. Further, if m > l, then there exist (m−1, n, l+1)-th order light, (m−2, n, l+2)-th order light, ... and (l−1, n, m+1)-th order light, reaching the sensor. In a case when l > m, the lights can be specified similarly.

As for the (m, n, l)-th order light, however, from equations (10) and (11), the positional deviation detecting magnification upon the sensor can be expressed by $f_m^M$, $f_n^W$, g and L, and it does not depend on l. Thus, generally it is expected that a light which satisfies equation (8) and which has the same diffraction order at the wafer grating lens cannot have the same magnification as the (m, n, l)-th order light and additionally that the focusability thereof on the sensor is remarkably degraded as compared with the (m, n, l)-th order light. In the present embodiment, the lens parameter setting, i.e., the setting of $f_m^M$ and $f_n^W$, is selected so as to assure that combinations of (m, n, l) satisfying equation (7), excluding those as determined by equation (8), provide the same magnification of positional deviation detection. In this embodiment, $\theta = 7$ degrees and $\lambda = 0.785$ microns are selected and, in equation (7), $\xi l = 13.0$ degrees and, in response, $P_M = 19.32$ microns and $P_W = 2.56$ microns. Also, in consideration of (m, n, l) = (−3, +1, 2), other combinations of orders which satisfy the relationship described above, are determined, and the parameter setting is effected so as to assure that any of these combinations provides the same detection magnification. From equation (7) and the parameters set hereinbefore, it follows that the relationships:

$$0.347 = 0.041(1+m) - 0.307n \quad (12\text{-}1)$$

$$n \neq 1, n \neq 0 \text{ and } 1+m \neq 0 \quad (12\text{-}2)$$

are the conditions to be satisfied by the combinations of (m, n, l) which is just to be detected. Here, the signal light impinging on the sensor has a beam diameter in a certain range, not equal to 0, and also the sensor has a certain finite area. In consideration thereof, in this embodiment, not those combinations of (m, n, l) that exactly satisfy equation (7), but all such combinations of (m, n, l) wherein $\xi l$ in equation (7) is kept in a predetermined range in accordance with the sensor area, are determined.

As an example, such a tolerable range for $\xi l$ can be set in the following manner: Assuming now that the positional deviation detection is executed one-dimensionally (along the X-axis direction), that the sensor detects the gravity center position of the light in the X-axis direction, and that the light receiving region is defined by a rectangular area of a size of dx in the X-axis direction and dy in the direction perpendicular thereto. If the distance to the center of the sensor from the center of an alignment mark on the final surface is denoted by l, the perspective angle ($\theta x$, $\theta y$) of the center of the alignment mark to the whole light receiving region of the sensor can be given by the following equations:

$$\theta x = 2\tan^{-1}(dx/2l)$$

$$\theta y = 2\tan^{-1}(dy/2l)$$

where $\theta x$ and $\theta y$ are perspective angles of the center of the alignment mark to the light receiving region of the sensor of a size (dx, dy), i.e., each being an angle defined between two lines extending from the center of the alignment mark to the edges of the light receiving region.

Here, as regards the tolerable range of $\xi l$, if such $\xi l$ that exactly satisfies equation (7) is denoted by $\xi^p$, then the range can be expressed as follows:

$$\xi^p - \theta y/2 \leq \xi l \leq \xi^p + \theta y/2 \quad (13)$$

Accordingly, when $\theta y/2 = 3.05$ (l = 18.765 mm and dy = 2.0 mm), equation (12-1) may be written as follows:

$$0.295 \leq 0.041(1+m) - 0.307n \leq 0.398 \quad (12\text{-}1')$$

It is seen therefrom that providing the same magnification, to $\epsilon$, for the displacements of gravity center positions for those combinations of (m, n, l) that satisfies equation (12-1) and (12-2), is the practical condition setting.

Assuming now that n = −1 and k = 1+m, equation (12-1') is written as:

$$-0.012 \leq 0.041k \leq 0.091 \quad (12\text{-}1'')$$

The solutions that satisfy equation (12-1") are k = 0, 1 and 2. Similarly, when solutions that satisfy equation (12-1') for n = −2 and n = 2 are detected, then the solutions are k = −6 and −7 (n = −2) and k = 23 and 24(n = 2. In this embodiment, on an assumption that the optical system is arranged so that (−3, 1, −2)-th order light is imaged on the sensor, of such solutions that satisfy equation (12-1'), a light or lights convergently incident on the sensor surface (including those not imaged thereupon) are extracted, and the magnification of the displacement gravity center position thereof to $\epsilon$ is set to be equal to that of the (−3, 1, −2)-th order light. In general, the light projecting and receiving optical arrangement including the sensor may be set to assure that, of plural lights of different combinations of diffraction orders m, n and l which can reach the light receiving region of the sensor, a particular one (referred to as signal light) satisfies the condition for the imaging. Also, the parameters such as the focal length of each alignment mark may be set to assure that, for such light of the other diffraction lights which is incident on the sensor as a convergent beam and which has high energy density like the signal light, the same magnification to $\epsilon$ as that of the signal light is provided to the displacement of gravity center position.

More specifically, if the magnification of (m, n, l)-th order light is denoted by $\beta$(m, n, l) and the magnification of (m', n', l')-th order light is denoted by $\beta$(m', n', l') wherein m' $\neq$ m, n' $\neq$ n or l' $\neq$ l, then the parameters $f_m^M$, $f_m^{M'}$, $f_n^W$, $f_n^{W'}$, $L_1'$, $L_1^*$ and $L_2$ may be determined on the basis of parameter analysis or the like, to satisfy the following relation:

$$\beta(m, n, l) = \beta(m', n', l') \tag{14}$$

where $f_m^{M'}$ is the focal length of the mask alignment mark responsive to m'-th order diffraction light, and $f_n^{W'}$ is the focal length of the wafer alignment mark responsive to n'-th order diffraction light. Also, combinations of diffraction orders, (m, n, l) and (m', n', l'), denote lights of different diffraction orders which show strength concentration of substantially the same degree, upon the light receiving region of the sensor.

Here, from equations (10) and (11), it follows that:

$$\beta(m, n, l) = [1 - L_1'/(f_m^M - g)][L_2/(L_1' - g)]$$

where $L_1'$ satisfies the following equation:

$$l(f_m^M - g) + lL_1' = -lf_n^{W'}$$

Similarly, $$\beta(m', n', l') = [1 - L_1^*/(f_m^{M'} - g)][L_2(L_2L_1^* - g)]$$

where $L_1^*$ satisfies the following equation:

$$l(f_m^{M'} - g) + lL_1^* = -lf_n^{W'}$$

Accordingly, equation (14) can be written as follows:

$$[1 - L_1'/(f_m^M - g)][L_2/(L_1' - g)] = \tag{15}$$
$$[1 - L_1^*/(f_m^{M'} - g)][L_2/(L_1^* - g)]$$

By setting the parameters so as to satisfy equation (15), it is possible to assure that the magnification, to $\beta$, for the displacement of gravity center position of the (m', n', l')-th order light, to be picked up, is made equal to that of the (m, n, l)-th order light which is the signal light.

The (m', n', l')-th order light may be determined on the basis of simultaneous numerical analysis as having been explained with reference to equations (12-1') and (12-1''). For example, of the combinations that satisfy:

$$|m'| \leq 3, |n'| \leq 3 \text{ and } |l'| \leq 3,$$

those that can provide such $\xi l$ which, when m, n and l in equation (7) are substituted by m', n' and l', has a quantity approximately equal to that of the (m, n, l)-th order light and also which satisfies the condition (equation (13)) for impingement of light upon the sensor surface, may be determined. This process is not necessarily based on an assumption that, in arbitrary design values (m, n, l), $f_m^M$, $f_n^W$, $L_1$ and $L_2$, there always exist specific values of (m', n', l'), $f_m^{M'}$ and $f_n^{W'}$ which satisfy equation (7) or equation (13). In this embodiment, however, if there is diffraction light of an unwanted order which satisfies equation (7) or (13), by setting the parameters so as to satisfy equation (15), for example, it is possible to avoid the inconveniences described hereinbefore.

The foregoing embodiments use the proportional relationship of the quantity of change in the spacing between the gravity center positions on two detecting means, along the X-axis direction, with the relative positional deviation of a mask and a wafer in the X-axis direction and the quantity of change in the spacing is detected. However, the present invention is not limited to this. For example, the invention is applicable to a deviation detecting method which, as is known in the art, uses the proportional relationship of displacement of a gravity center position on a single detecting means, from a reference position, with the relative positional deviation of a mask and a wafer in the X-axis direction.

Thus, in accordance with an aspect of the present invention, there is provided a method of detecting relative positional deviation between a first object and a second object: wherein diffraction gratings are so formed on the first and second objects, respectively, that, when m, n and l denote integers, the position of incidence upon a predetermined plane of first light having been emitted by a light source, having been diffracted at m-th order by the first object, having been diffracted at n-th order by the second object and having again diffracted at l-th order by the first object, is changeable at a predetermined magnification to the quantity of relative positional deviation of the first and second objects, and also that, when m', n' and l' are integers wherein m' $\neq$ m, n' $\neq$ n or l' $\neq$ l, the position of incidence upon a predetermined plane of second light having been diffracted at m'-th order by the first object, having been diffracted at n'-th order by the second object and having again being diffracted at l'-th order by the first object, is displaceable at the same magnification as that of the first light, to the same relative positional deviation of the first and second objects; and wherein the relative deviation of the first and second objects is detected on the basis of the positions of incidence of the first and second lights upon the predetermined plane. The magnification, to the quantity of positional deviation, of displacement of the gravity center position upon the predetermined plane of a particular light or lights, among those lights which are different from a main light, mainly used for the positional deviation detection, with respect to the quantity of any one of diffraction orders m, n and l, which particular light or lights are incident on substantially the same portion of the predetermined plane, is set substantially equal to that of the signal light (main light). By this, it is possible to increase the precision of detection. Also, even if there occurs a change in the ratio of light quantity between the first and second lights which are different with respect to the history of diffraction order, due to a change in the wafer process factor such as a change in the thickness of a resist film, for example, it is possible to prevent a change in the effective magnification of positional deviation detection.

Further, if the ratio of light intensity between different diffraction lights having different diffraction orders (m, n, l) changes due to a change in the relative position of first and second objects in a direction perpendicular to the positional deviation detecting direction, the effective magnification of positional deviation detection can be held unchanged.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting relative positional deviation of first and second objects, wherein the first object is provided with a first grating mark having an optical power while the second object is provided with a second grating mark having an optical power, said method comprising the steps of:

illuminating the first and second objects with light such that light diffracted by both the first and second grating marks forms a light pattern on a predetermined plane;

superposing different diffraction beams of the light diffracted by both the first and second grating marks one upon another with their centers substantially coinciding with each other to form the light pattern;

displacing the diffraction beams along the predetermined plane in accordance with the relative positional deviation of the first and second objects, in the same direction and by substantially the same quantity; and detecting the relative positional deviation of the first and second objects on the basis of the position of the light pattern on the predetermined plane.

2. A method according to claim 1, further comprising disposing the first and second objects substantially overlapped and projecting a radiation beam to the first and second objects, from above the first object, and wherein the predetermined plane is above the first object.

3. A method according to claim 2, further comprising producing the different diffraction beams as negative first order diffraction light produced as a result of reflective diffraction by the second grating mark of positive first order diffraction light from the first grating mark, and positive first order diffraction light produced as a result of diffraction by the first grating mark of negative first order diffraction light resulting from reflective diffraction by the second grating mark.

4. A method according to claim 2, further comprising producing the different diffraction beams as positive first order diffraction light produced as a result of reflective diffraction by the second grating mark of negative first order diffraction light from the first grating mark, and negative first order diffraction light produced as a result of diffraction by the first grating mark of positive first order diffraction light resulting from reflective diffraction by the second grating mark.

5. A method according to any one of claims 2-4, further comprising producing the different diffraction beams by diffracting a light beam only once by the first grating mark and diffracting a light beam only once by the second grating mark.

6. A method according to claim 2, further comprising producing the different diffraction beams by diffracting a light beam twice by the first grating mark and diffracting a light beam only once by the second grating mark.

7. A method according to claim 1, wherein the positional deviation detected in said detecting step is determined on the basis of the position of a gravity center of an intensity distribution of the light pattern.

8. An exposure apparatus usable with a mask provided with a circuit pattern and a first grating mark having an optical power and a wafer provided with a second grating mark having an optical power, for exposing the wafer to the pattern of the mask, said apparatus comprising:

first holding means for holding the mask;
second holding means for holding the wafer;
driving means means for relatively moving said first and second holding means;
an alignment system cooperable with the first and second grating marks of the mask and the wafer and including a light source and a detector, wherein light from said light source is diffracted by both the first and second grating marks and different diffraction beams of the light diffracted by both the first and second grating marks are superposed one upon another with their centers substantially coinciding with each other, to form a light pattern upon said detector, and wherein the diffraction beams are displaceable on said detector in accordance with a relative positional deviation of the mask and the wafer, in the same direction and by substantially the same quantity;
control means for controlling said driving means on the basis of a position of the light pattern on said detector, to adjust the relative position of the mask and the wafer; and
exposing means for exposing the wafer to the circuit patter of the mask.

9. An apparatus according to claim 8, wherein said alignment system comprises an optical system for transforming the light from said light source into a substantially parallel light beam and for directing the light beam to the mask and the wafer, and wherein, with cooperation of the first and second grating marks with the directed light beam, the different diffraction beams are produced and directed to said detector.

10. An apparatus according to claim 9 wherein the different diffraction beams comprise negative first order diffraction light produced as a result of reflective diffraction by the second grating mark of positive first order diffraction light from the first grating mark, and positive first order diffraction light produced as a result of diffraction by the first grating mark of negative first order diffraction light resulting from reflective diffraction by the second grating mark.

11. An apparatus according to claim 9, wherein the different diffraction beams comprise positive first order diffraction light produced as a result of reflective diffraction by the second grating mark of negative first order diffraction light from the first grating mark, and negative first order diffraction light produced as a result of diffraction by the first grating mark of positive first order diffraction light resulting from reflective diffraction by the second grating mark.

12. An apparatus according to any one of claims 8-11, wherein said control means detects the position of a gravity center of the light pattern on the basis of a signal from said detector, and determines the positional deviation on the basis of the detected gravity center position.

13. A method of manufacturing semiconductor devices by transferring a circuit pattern of a mask to a wafer and by processing the wafer, wherein the mask is provided with a first grating mark having an optical power while the wafer is provided with a second grating mark having an optical power, said method comprising the steps of:

illuminating the mask and wafer with light such that light diffracted by both the first and second grating marks forms a light pattern on a predetermined plane;

superposing different diffraction beams of the light diffracted by both the first and second grating marks one upon another with their centers substantially coinciding with each other to form the light pattern;

displacing the diffraction beams along the predetermined plane in accordance with a relative positional deviation of the mask and the wafer, in the same direction and by substantially the same quantity;

detecting the relative positional deviation of the mask and the wafer on the basis of the position of the light pattern on the predetermined plane; and exposing the wafer to the circuit pattern of the mask with the relative positional deviation being corrected.

14. A method according to claim 13, further comprising producing the different diffraction beams as negative first order diffraction light produced as a result of reflective diffraction by the second grating mark of positive first order diffraction light from the first grating mark, and positive first order diffraction light produced as a result of diffraction by the first grating mark of negative first order diffraction light resulting from reflective diffraction by the second grating mark.

15. A method according to claim 13, further comprising producing the different diffraction beams as positive first order diffraction light produced as a result of reflective diffraction by the second grating mark of negative first order diffraction light from the first grating mark, and negative first order diffraction light produced as a result of diffraction by the first grating mark of positive first order diffraction light resulting from reflective diffraction by the second grating mark.

16. A method according to any one of claims 13-15, wherein the positional deviation detected in said detecting step is determined on the basis of the position of a gravity center of an intensity distribution of the light pattern.

17. A method according to claim 13, wherein said exposing step comprises exposing the wafer with X-rays.

18. A method of detecting relative position deviation of a first object with a first grating pattern having an optical power and a second object with a second grating mark having an optical power, said method comprising the steps of:

illuminating the first and second objects with light such that light diffracted by both the first and second grating marks forms a light pattern on a predetermined plane;

displacing different diffraction beams of the light diffracted by both the first and second grating marks along the predetermined plane in accordance with the relative positional deviation of the first and second objects, in the same direction and by substantially the same quantity; and detecting the relative positional deviation of the first and second objects on the basis of the position of the light pattern on the predetermined plane.

19. A method according to claim 18, wherein the first and second objects are disposed to be substantially overlapped and the predetermined plane is above the first object, and further comprising projecting a radiation beam to the first and second objects from above the first object.

20. A method according to claim 19, wherein the different diffraction beams comprise negative first order diffraction light produced as a result of reflective diffraction, by the second grating mark, of positive first order diffraction light from the first grating mark, and positive first order diffraction light produced as a result of diffraction, by the first grating mark, of negative first order diffraction light resulting from reflective diffraction by the second grating mark.

21. A method according to claim 19, wherein the different diffraction beams comprise positive first order diffraction light produced as a result of reflective diffraction, by the second grating mark, of negative first order diffraction light from the first grating mark, and negative first order diffraction light produced as a result of diffraction, by the first grating mark, of positive first order diffraction light resulting from reflective diffraction by the second grating mark.

22. An apparatus according to any one of claims 19 through 21, wherein the different diffraction beams comprise a light beam diffracted only once by the first grating mark and a light beam diffracted only once by the second grating mark.

23. A method according to claim 18, further comprising determining the positional deviation on the basis of the position of a gravity center of an intensity distribution of the light pattern.

24. A method of detecting relative positional deviation of a first object with a first grating mark having an optical power and a second object with a second grating mark having an optical power, said method comprising the steps of:

illuminating the first and second objects with light such that light diffracted by both the first and second grating marks forms a light pattern on a predetermined plane;

superposing different diffraction beams of the light diffracted by both the first and second grating marks one upon another to form the light pattern which is displaceable along the predetermined plane in accordance with the relative positional deviation of the first and second objects while holding centers of the diffraction beams substantially coincident with each other; and detecting the relative positional deviation of the first and second objects on the basis of the position of the light pattern on the predetermined plane.

25. A method according to claim 24, wherein the different diffraction beams comprise a light beam diffracted twice by the first grating mark and a light beam diffracted only once by the second grating mark.

26. A method according to claim 24, wherein the first and second objects are disposed to be substantially overlapped and the predetermined plane is above the first object, and further comprising projecting a radiation beam to the first and second objects from above the first object.

27. A method according to claim 26, wherein the different diffraction beams comprise negative first order diffraction light produced as a result of reflective diffraction, by the second grating mark, of positive first order diffraction light from the first grating mark, and positive first order diffraction light produced as a result of diffraction, by the first grating mark, of negative first order diffraction light resulting from reflective diffraction by the second grating mark.

28. A method according to claim 26, wherein the different diffraction beams comprise positive first order diffraction light produced as a result of reflective diffraction, by the second grating mark, of negative first order diffraction light from the first grating mark, and negative first order diffraction light produced as a result of diffraction, by the first grating mark, of positive first order diffraction light resulting from reflective diffraction by the second grating mark.

29. A method according to claim 26, wherein the different diffraction beams comprise a light beam diffracted twice by the first grating mark and a light beam diffracted only once by the second grating mark.

30. A method according to claim 24, further comprising determining the positional deviation on the basis of the position of a gravity center of an intensity distribution of the light pattern.

31. An exposure apparatus usable with a mask provided with a circuit pattern and a first grating mark having an optical power and a wafer provided with a second grating mark having an optical power, for exposing the wafer to the pattern of the mask, said apparatus comprising:
    first holding means for holding the mask;
    second holding means for relatively moving said first and second holding means;
    driving means for relatively moving said first and second holding means;
    an alignment system, cooperating with the first and second grating marks of the mask and the wafer, comprising a light source and a detector, wherein light from said light source is diffracted by both the first and second grating marks and different diffraction beams of the light diffracted by both the first and second grating marks are directed to said detector to form a light pattern upon said detector, and the diffraction beams are displaceable on said detector in accordance with a relative positional deviation of the mask and the wafer, in the same direction and by substantially the same quantity;
    control means for controlling said driving means on the basis of a position of the light pattern on said detector, to adjust the relative position of the mask and the wafer; and
    exposing means for exposing the wafer to the circuit pattern of the mask.

32. An apparatus according to claim 31, wherein said alignment system comprises an optical system for transforming the light from said light source into a substantially parallel light beam and for directing the light beam to the mask and the wafer, and wherein the different diffraction beams are produced and directed to said detector by the directed light beam illuminating the first and second grating marks.

33. An apparatus according to claim 32, wherein the different diffraction beams comprise negative first order diffraction light produced as a result of reflective diffraction, by the second grating mark, of positive first order diffraction light from the first grating mark, and positive first order diffraction light produced as a result of diffraction, by the first grating mark, of negative first order diffraction light resulting from reflective diffraction by the second grating mark.

34. An apparatus according to claim 32, wherein the different diffraction beams comprise positive first order diffraction light produced as a result of reflective diffraction, by the second grating mark, of negative first order diffraction light from the first grating mark, and negative first order diffraction light produced as a result of diffraction, by the first grating mark, of positive first order diffraction light resulting from reflective diffraction by the second grating mark.

35. An apparatus according to any one of claims 31 through 34, wherein said control means comprises means for detecting the position of a gravity center of the light pattern on the basis of a signal from said detector, and for determining the positional deviation on the basis of the detected gravity center position.

36. A method of manufacturing semiconductor devices by transferring a circuit pattern of a mask to a wafer and by processing the wafer, wherein (i) the mask is provided with a first grating mark having an optical power while the wafer is provided with a second grating mark having an optical power, (ii) light diffracted by both the first and second grating marks forms a light pattern on a plane when illuminating the first and second objects, (iii) different diffraction beams of the light diffracted by both the first and second grating marks are displaceable along the plane in accordance with a relative positional deviation of the mask and the wafer, in the same direction and by substantially the same quantity, said method comprising the steps of:
    generating the light pattern by the illumination;
    detecting the relative positional deviation of the mask and the wafer on the basis of the position of the light pattern on the plane;
    correcting the relative positional deviation; and
    exposing the wafer to the circuit pattern of the mask.

37. A method according to claim 36, wherein the different diffraction beams comprise negative first order diffraction light produced as a result of reflective diffraction, by the second grating mark, of positive first order diffraction light from the first grating mark, and positive first order diffraction light produced as a result of diffraction, by the first grating mark, of negative first order diffraction light resulting from reflective diffraction by the second grating mark.

38. A method according to claim 36, wherein the different diffraction beams comprise positive first order diffraction light produced as a result of reflective diffraction, by the second grating mark, of negative first order diffraction light from the first grating mark, and positive first order diffraction light produced as a result of diffraction, by the first grating mark, of positive first order diffraction light resulting from reflective diffraction by the second grating mark.

39. A method according to any one of claims 36 through 38, further comprises determining the positional deviation on the basis of the position of a gravity center of an intensity distribution of the light pattern.

40. A method according to claim 31, further comprising effecting the exposure of the wafer by using X-rays.

41. A method according to any one of claims 36 through 38, 40 and 26, wherein the different diffraction beams comprise a light beam diffracted only once by the first grating mark and a light beam diffracted only once by the second grating mark.

42. A method according to claim 39, wherein the different diffraction beams comprise a light beam diffracted only once by the first grating mark and a light beam diffracted only once by the second grating mark.

43. An exposure apparatus usable with a mask provided with a circuit pattern and a first grating mark having an optical power and a wafer provided with a second grating mark having an optical power, for exposing the wafer to the pattern of the mask, said apparatus comprising:
    first holding means for holding the mask;
    second holding means for holding the wafer;
    driving means for relatively moving said first and second holding means;
    an alignment system, cooperating with the first and second grating marks of the mask and the wafer, comprising a light source and a detector, wherein light from said light source is diffracted by both the first and second grating marks and different diffraction beams of the light diffracted by both the first and second grating marks are superposed one upon another to form a light pattern upon said detector, and the diffraction beams are displaceable on said detector in accordance with a relative positional deviation of the mask and the wafer while centers of the diffraction beams are held substantially coincident with each other;

control means for controlling said driving means on the basis of a position of the light pattern on said detector, to adjust the relative position of the mask and the wafer; and exposing mens for exposing the wafer to the circuit pattern of the mask.

44. An apparatus according to claim 43, wherein said alignment system comprises an optical system for transforming the light from said light source into a substantially parallel light beam and for directing the light beam to the mask and the wafer, and wherein with cooperation of the first and second grating marks with the directed light beam, the different diffraction beams are produced and directed to said detector by the directed light beam illuminating the first and second grating marks.

45. An apparatus according to claim 44, wherein the different diffraction beams comprise negative first order diffraction light produced as a result of reflective diffraction, by the second grating mark, of positive first order diffraction light from the first grating mark, and positive first order diffraction light produced as a result of diffraction, by the first grating mark, of negative first order diffraction light resulting from reflective diffraction by the second grating mark.

46. An apparatus according to claim 45, wherein the different diffraction beams comprise positive first order diffraction light produced as a result of reflective diffraction, by the second grating mark, of negative first order diffraction light produced as a result of diffraction, by the first grating mark, of positive first order diffraction light resulting from reflective diffraction by the second grating mark.

47. An apparatus according to any one of claims 43 through 46, wherein said control means comprises means for detecting the position of a gravity center of the light pattern on the basis of a signal from said detector, and for determining the positional deviation on the basis of the detected gravity center position.

48. A method of manufacturing semiconductor devices by transferring a circuit pattern of a mask to a wafer and by processing the wafer, wherein (i) the mask is provided with a first grating mark having an optical power while the wafer is provided with a second grating mark having an optical power, (ii) light diffracted by both the first and second grating marks forms a light pattern on a plane when illuminating the first and second objects, (iii) different diffraction beams of the light diffracted by both the first and second grating marks are superposed one upon another to form the light pattern which is displaceable along the plane in accordance with a relative positional deviation of the mask and the wafer, while centers of the diffraction beams are held substantially coincident with each other, said method comprising the steps of:

generating the light pattern by the illumination;

detecting the relative positional deviation of the mask and the wafer on the basis of the position of the light pattern on the plane;

correcting the relative positional deviation; and exposing the wafer to the circuit pattern of the mask.

49. A method according to claim 46, wherein the different diffraction beams comprise negative first order diffraction light produced as a result of reflective diffraction, by the second grating mark, of positive first order diffraction light from the first grating mark, and positive first order diffraction light produced as a result of diffraction, by the first grating mark, of negative first order diffraction light resulting from reflective diffraction by the second grating mark.

50. A method according to claim 48, wherein the different diffraction beams comprise positive first order diffraction light produced as a result of reflective diffraction, by the second grating mark, of negative first order diffraction light from the first grating mark, and negative first order diffraction light produced as a result of diffraction, by the first grating mark, of positive first order diffraction light resulting from reflective diffraction by the second grating mark.

51. A method according to any one of claim 48 through 50, further comprising determining the positional deviation on the basis of the position of a gravity center of an intensity distribution of the light pattern.

52. A method according to claim 50, further comprising effecting the exposure of the wafer by using X-rays.

53. A method of detecting a positional deviation between first and second objects, said method comprising the steps of:

providing the first object with a first grating mark and providing the second object with a second grating mark, wherein the first and second grating marks are so arranged that the positions, upon a predetermined plane, of first and second diffraction beams, of light diffracted by both the first and second grating marks in response to illumination of the first and second objects, are displaceable in the same direction on the plane and by substantially the same amount in accordance with the positional deviation of the first and second objects;

illuminating the first and second objects to project the first and second diffraction beams on the plane to form a beam pattern on the plane; and determining the positional deviation of the first and second objects on the basis of the position of the beam pattern on the plane.

54. A method according to claim 53, wherein the first and second grating marks are so arranged that the centers of the first and second beams on the plane substantially coincide with each other.

55. A method according to claim 53, wherein each of the first and second grating patterns comprises a zone plate pattern.

56. A method according to claim 53, wherein each of the first and second diffraction beams comprises a beam diffracted at a first diffraction order by both of the first and second grating marks.

57. A device for detecting a positional deviation between a first object having a first grating mark and a second object having a second grating mark, said device comprising:

means for illuminating the first and second objects, wherein a beam diffracted by both the first and second grating marks in response to the illumination produces a beam pattern on a predetermined plane, and the positions on the plane of first and second diffraction beams of the diffracted beam are displaceable in the same direction and by substantially the same amount in accordance with the positional deviation of the first and second objects; and detecting means, having a detection surface disposed substantially coincident with the plane, for producing a signal corresponding to the position of the beam pattern on said plane.

58. A device according to claim 57, wherein the first and second grating marks are so arranged that the centers of the first and second beams on the plane substantially coincide with each other.

59. A device according to claim 57, wherein each of the first and second grating patterns comprises a zone plate pattern.

60. A device according to claim 57, wherein each of the first and second diffraction beams comprises a beam diffracted at a first diffraction order by both of the first and second grating marks.

61. An apparatus for aligning a first object having a first grating mark and a second object having a second grating mark, said apparatus comprising:

means for illuminating the first and second objects, wherein a beam diffracted by both the first and second grating marks in response to the illumination produces a beam pattern on a predetermined plane, and wherein the positions on the plane of first and second diffraction beams of the diffraction beam are displaceable in the same direction and by substantially the same amount in accordance with the positional deviation of the first and second objects;

detecting means, having a detection surface disposed substantially coincident with the plane, for producing a signal corresponding to the position of the beam pattern on the plane; and means for adjusting the relative position of the first and second objects in response to the signal from said detecting means.

62. An apparatus according to claim 61, wherein the first and second grating marks are so arranged that the centers of the first and second beams on the plane substantially coincide with each other.

63. An apparatus according to claim 61, wherein each of the first and second grating patterns comprises a zone plate pattern.

64. An apparatus according to claim 61, wherein each of the first and second diffraction beams comprises a beam diffracted at a first diffraction order by both of the first and second grating marks.

65. An apparatus for aligning a mask having a first grating mark and a wafer having a second grating mark, and for exposing the wafer to a pattern of the mask, said apparatus comprising:

means for illuminating the mask and the wafer, wherein a beam diffracted by both the first and second grating marks in response to the illumination produces a beam pattern on a predetermined plane, and the positions on the plane of first and second diffraction beams of the diffracted beam are displaceable in the same direction and by substantially the same amount in accordance with the positional deviation of the mask and the wafer;

detecting means, having a detection surface disposed substantially coincident with the plane, for producing a signal corresponding to the position of the beam pattern on the plane; and means for adjusting the relative position of the mask and the wafer in response to the signal from said detecting means.

66. An apparatus according to claim 65, wherein the first and second grating marks are so arranged that the centers of the first and second beams of the plane substantially coincide with each other.

67. An apparatus according to claim 65, wherein each of the first and second grating patterns comprises a zone plate pattern.

68. An apparatus according to claim 65, wherein each of the first and second diffraction beams comprises a beam diffracted at a first diffraction order by both of the first and second grating marks.

69. A semiconductor device manufacturing method, wherein a mask having a first grating mark and a wafer having a second grating mark are aligned with each other and the wafer is exposed to a circuit pattern of the mask whereby the pattern is printed on the wafer, said method comprising the steps of:

illuminating the mask and the wafer, such that a beam pattern is formed on a predetermined plane by a beam diffracted by both the first and second grating marks, wherein the positions on the plane of first and second diffraction beams of the diffracted beam are displaceable in the same direction and by substantially the same amount in accordance with the positional deviation of the mask and the wafer; and aligning the mask and the wafer on the basis of the position of the beam pattern on the plane.

70. A method according to claim 69, wherein the first and second grating marks are so arranged that the centers of the first and second beams on the plane substantially coincide with each other.

71. A method according to claim 69, wherein each of the first and second grating patterns comprises a zone plate pattern.

72. A method according to claim 69, wherein each of the first and second diffraction beams comprises a beam diffracted at a first diffraction order by both of the first and second grating marks.

* * * * *

UNITED STATES PATENT AND TRADEMARK OFFICE
CERTIFICATE OF CORRECTION

PATENT NO. : 5,225,892
DATED : July 6, 1993
INVENTOR(S) : Masakazu Matsugu, et al.

It is certified that error appears in the above-indentified patent and that said Letters Patent is hereby corrected as shown below:

On title page, item [56]

UNDER "U.S. PATENT DOCUMENTS"

The following should be inserted:

--4,514,858  4/1985  Novak............ 378/34--.

COLUMN 2

Line 40, "B" should read --By--.

COLUMN 4

Line 7, "ar" should read --are--.

COLUMN 7

Line 29, "denotes" should read --$\epsilon$ denotes--.
Line 49, "these" should read --those--.

UNITED STATES PATENT AND TRADEMARK OFFICE
CERTIFICATE OF CORRECTION

PATENT NO. : 5,225,892
DATED : July 6, 1993
INVENTOR(S) : Masakazu Matsugu, et al.

It is certified that error appears in the above-indentified patent and that said Letters Patent is hereby corrected as shown below:

COLUMN 10

Line 23, "$S_{11} = [-L/(f_{a1}-g)]\epsilon$" should read --$S_{11} = [1-L/(f_{a1}-g)]\epsilon$--.
Line 33, "deviation" should read --deviation $\epsilon$--.
Line 36, "light 7" should read --light 7',--.
Line 37, ", upon" should read --upon--.

COLUMN 11

Line 35, "÷" should read --$\div$--.

COLUMN 12

Line 2, "directly this" should read --this directly--.
Line 41, "th" should read --the--.
Line 55, "th" should read --the--.

COLUMN 13

Line 31, "peripheral. part" should read --peripheral part--.
Line 46, "th" should read --the--.

UNITED STATES PATENT AND TRADEMARK OFFICE
CERTIFICATE OF CORRECTION

PATENT NO. : 5,225,892
DATED : July 6, 1993
INVENTOR(S) : Masakazu Matsugu, et al.

It is certified that error appears in the above-indentified patent and that said Letters Patent is hereby corrected as shown below:

COLUMN 14

Line 42, "$\div$" should read --$\dot{\div}$--.

COLUMN 15

Line 4, "$\beta = 1-L/f_{a1}-g)$" should read --$\beta = 1-L/(f_{a1}-g)$--.

COLUMN 16

Line 39, "and 0,n," should read --and (0,n,--.

COLUMN 17

Line 6, "L" should read --$L_1$--.
Line 8, "$1/fm^M-g)$" should read --$1/(fm^M-g)$--.

UNITED STATES PATENT AND TRADEMARK OFFICE
CERTIFICATE OF CORRECTION

PATENT NO. : 5,225,892

DATED : July 6, 1993

INVENTOR(S) : Masakazu Matsugu, et al.

It is certified that error appears in the above-indentified patent and that said Letters Patent is hereby corrected as shown below:

COLUMN 18

Line 1, "thereto. If" should read --thereto, if--.
Line 31, "satisfies" should read --satisfy--.
Line 32, "equation" should read --equations--.
Line 37, "(12-1)" should read --(12-1")--.
Line 43, "24(n=2." should read --24 (n=2).--

COLUMN 19

Line 1, "$fm^{M'}$," should read --$fm'^{M}$,--; and "$fn^{W'}$," should read --$fn'^{W}$,--.
Line 6, "$fm^{M'}$" should read --$fm'^{M}$--.
Line 8, "$fn^{W'}$" should read --$fn'^{W}$--.
Line 20, "$1(fm^M-g)+1L_1'=-1fn^W$" should read --$1/fm^M-g)+1/L_1'=-1fn^W$--.
Line 23, "$[1-L_1*(fm^{M'}-g)][L_2(L_2L_1*-g)]$" should read --$[1-L_1*/(fm'^M-g)][L_2/(L_1*-g)]$--.
Line 27, "$1(fm^{M'}-g)+1L_1*=-1fn^{W'}$" should read --$1/(fm'^M-g)+1/L_1*=-1fn'^W$--.
Line 35, "to $\beta$," should read --to $\epsilon$,--.
Line 41, "analysis" should read --analyses--.
Line 55, "$fm^{M'}$ and $fn^{W'}$" should read --$fm'^M$ and $fn'^W$--.

UNITED STATES PATENT AND TRADEMARK OFFICE
CERTIFICATE OF CORRECTION

PATENT NO. : 5,225,892
DATED : July 6, 1993
INVENTOR(S) : Masakazu Matsugu, et al.

It is certified that error appears in the above-indentified patent and that said Letters Patent is hereby corrected as shown below:

COLUMN 22

Line 17, "patter" should read --pattern--.

COLUMN 26

Line 40, "comprises" should read --comprising--.

COLUMN 30

Line 17, "of" (second occurrence) should read --on--.

Signed and Sealed this

Third Day of May, 1994

BRUCE LEHMAN

Attesting Officer    Commissioner of Patents and Trademarks